(12) United States Patent
Ishikawa et al.

(10) Patent No.: US 9,969,023 B2
(45) Date of Patent: May 15, 2018

(54) VISCOUS FLUID COATING DEVICE

(71) Applicant: FUJI MACHINE MFG. CO., LTD., Chiryu (JP)

(72) Inventors: Nobuyuki Ishikawa, Nagoya (JP); Katsunori Tanaka, Kasugai (JP); Mitsuhiro Nishibori, Anjyo (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days. days.

(21) Appl. No.: 15/122,113

(22) PCT Filed: Feb. 28, 2014

(86) PCT No.: PCT/JP2014/055105
§ 371 (c)(1),
(2) Date: Aug. 26, 2016

(87) PCT Pub. No.: WO2015/129034
PCT Pub. Date: Sep. 3, 2015

(65) Prior Publication Data
US 2017/0066072 A1 Mar. 9, 2017

(51) Int. Cl.
*B23K 1/00* (2006.01)
*B23K 31/02* (2006.01)
(Continued)

(52) U.S. Cl.
CPC .......... *B23K 3/0638* (2013.01); *B23K 1/0016* (2013.01); *B23K 1/08* (2013.01);
(Continued)

(58) Field of Classification Search
CPC ............................. B23K 3/0653; B23K 3/085
(Continued)

(56) References Cited

U.S. PATENT DOCUMENTS 3,597,645 A * 8/1971 Duffert ............... H02K 1/20
310/14
4,208,597 A * 6/1980 Mulach ............... H02K 1/20
174/DIG. 20
(Continued)

FOREIGN PATENT DOCUMENTS

GB  2 418 881 A  4/2006
JP  4-21644 Y2  5/1992
(Continued)

OTHER PUBLICATIONS

International Search Report dated Apr. 22, 2014 in PCT/JP14/055105 Filed Feb. 28, 2014.
(Continued)

*Primary Examiner* — Erin B Saad
(74) *Attorney, Agent, or Firm* — Oblon, McClelland, Maier & Neustadt, L.L.P.

(57) ABSTRACT

Solder housed in flow tank 20 is ejected from nozzle 22 by a pump provided inside flow tank 20. Jet motor 26 that drives the pump is provided outside flow tank 20, and cooling device 30 is provided between flow tank 20 and jet motor 26. Cooling device 30 includes cooling pipe 52 that is formed folded back on itself. Nitrogen gas is supplied from an upper end of cooling pipe 52, flows along cooling pipe 52, and flows out of a lower end of cooling pipe 52 so as to be supplied to flow tank 20. The temperature of the nitrogen gas increases due to heat dissipated from jet motor 26, thus lowering the temperature of jet motor 26. Heat is transferred from jet motor 26 to the nitrogen gas, and jet motor 26 is cooled satisfactorily.

10 Claims, 4 Drawing Sheets

(51) Int. Cl.
*B23K 3/06* (2006.01)
*B23K 1/08* (2006.01)
*H05K 3/34* (2006.01)
*B23K 3/08* (2006.01)
*B23K 101/42* (2006.01)

(52) U.S. Cl.
CPC ................ *B23K 3/06* (2013.01); *B23K 3/085* (2013.01); *B23K 31/02* (2013.01); *H05K 3/3468* (2013.01); *B23K 2201/42* (2013.01); *H05K 2203/081* (2013.01)

(58) Field of Classification Search
USPC .............................. 228/37, 56.1; 165/104.34
See application file for complete search history.

(56) References Cited

U.S. PATENT DOCUMENTS

| 2007/1001765 | | 1/2007 | Lehman et al. | |
| 2009/0079278 | A1* | 3/2009 | Kramer ................... | H02K 5/20 310/54 |
| 2009/0321498 | A1* | 12/2009 | Zen ....................... | B23K 3/0653 228/37 |
| 2010/0071876 | A1 | 3/2010 | Lehman et al. | |
| 2012/0305224 | A1* | 12/2012 | Kim ....................... | F04D 17/127 165/104.34 |
| 2014/0027495 | A1 | 1/2014 | Arslanian et al. | |

FOREIGN PATENT DOCUMENTS

| JP | 11-307926 A | 11/1999 |
| JP | 2003-179340 A | 6/2003 |
| JP | 2008-109034 A | 5/2008 |

OTHER PUBLICATIONS

Extended European Search Report dated Feb. 23, 2017 in Application No. 14884005.1.

"Design Brief: Industrial Process Heat Recovery" Energy Design Resources, XP055345579, pp. 1-32.

* cited by examiner

VISCOUS FLUID COATING DEVICE

CROSS-REFERENCE TO RELATED APPLICATIONS

This application claims priority to PCT/JP2014/055105 filed Feb. 28, 2014 the contents of which are incorporated herein by reference in their entirety.

TECHNICAL FIELD

The present disclosure relates to a viscous fluid coating device that is a configuration element of an electronic component mounter.

BACKGROUND ART

Disclosed in patent literature 1 is a solder coating device that includes (a) a flow tank that houses solder in a molten state, (b) an electromagnetic pump, provided inside the flow tank, that ejects solder from an ejection outlet to coat the solder on a circuit board, and (c) a cooling device that cools the electromagnetic pump by supplying nitrogen gas to the electromagnetic pump.

CITATION LIST

Patent Literature

Patent Literature 1
JP-A-2003-179340

SUMMARY

Means for Solving the Problem

An object of the present disclosure is to cool a jet motor attached to the outside of a flow tank.

Effects

In the present disclosure of a viscous fluid coating device, a cooling device is provided that cools a jet motor provided outside a flow tank using a fluid body. Because the jet motor is cooled by the cooling device, trouble caused by the jet motor overheating is less likely to occur, and a viscous fluid can be coated on a circuit board stably.

(1) A viscous fluid coating comprising: a flow tank that houses a viscous fluid in a molten state; a pump, operation of which ejects viscous fluid from the flow tank such that viscous fluid is coated on a circuit board; a jet motor, provided outside the flow tank, that drives the pump; and a cooling device, provided outside the flow tank and including a passage through which a fluid body is capable of flowing, that cools the jet motor using the fluid body. Viscous fluid is a material that is solid at room temperature and that melts when heated to become a liquid with viscosity. Viscous fluid may be, for example, solder paste formed by melting solder, which is housed in a molten state in the flow tank. In contrast, the liquid body used in the cooling device may be a liquid or gas that is fluid at room temperature.

(2) The viscous fluid coating device according to clause (1), wherein the cooling device is provided between the flow tank and the jet motor.

(3) The viscous fluid coating device according to clause (1) or clause (2), wherein at least a portion of the passage is provided between the flow tank and the jet motor. It is sufficient for a portion of the passage to be between the flow tank and the jet motor; the entire passage does not have to be positioned between the flow tank and the jet motor. The passage may be straight or curved, for example, the passage may have a form including multiple curved sections such that the passage folds back on itself, or the passage may be coil-shaped, spiral-shaped, or the like.

(4) The viscous fluid coating device according to any one of the clauses (1) to (3), wherein the cooling device is provided in a state connected to the jet motor.

(5) The viscous fluid coating device according to any one of the clauses (1) to (4), wherein the passage includes multiple curved sections, and the cooling device includes a heat exchange section provided with the passage formed from the multiple curved sections. The cooling device may also be a heat sink.

(6) The viscous fluid coating device according to any one of the clauses (1) to (5), wherein the cooling device includes (a) a pipe, and (b) a pipe holding section that holds the pipe.

(7) The viscous fluid coating device according to any one of the clauses (1) to (5), wherein the cooling device (a) has a passage-use hole-forming member that is open at both ends and has a passage-use hole formed piercing through in the thickness direction, and (b) two blocking members that block the openings at both ends and are joined to the passage-use hole-forming member from the thickness direction. The passage-use hole-forming member and the two blocking members are joined to each other in an airtight or liquid-tight manner.

(8) The viscous fluid coating device according to any one of the clauses (1) to (7), wherein the fluid body is an antioxidation gas for preventing oxidation of solder as the fluid body, and a downstream end of the passage is connected to the flow tank. An inert gas such as helium, or a gas such as nitrogen, may be used as the antioxidation gas.

(9) The viscous fluid coating device according to any one of the clauses (1) to (8), wherein the fluid body is lighter than air, the downstream end of the passage is connected to a gas supply source, and the upstream end of the passage is connected to the flow tank. When the relative weight of the fluid being used as the fluid body is lighter than air, the fluid moves from down to up inside the passage. Thus, if the shape of the passage is such that flow from up to down does not occur, the fluid will flow through the passage satisfactorily.

DESCRIPTION OF EMBODIMENTS

Figure 1:
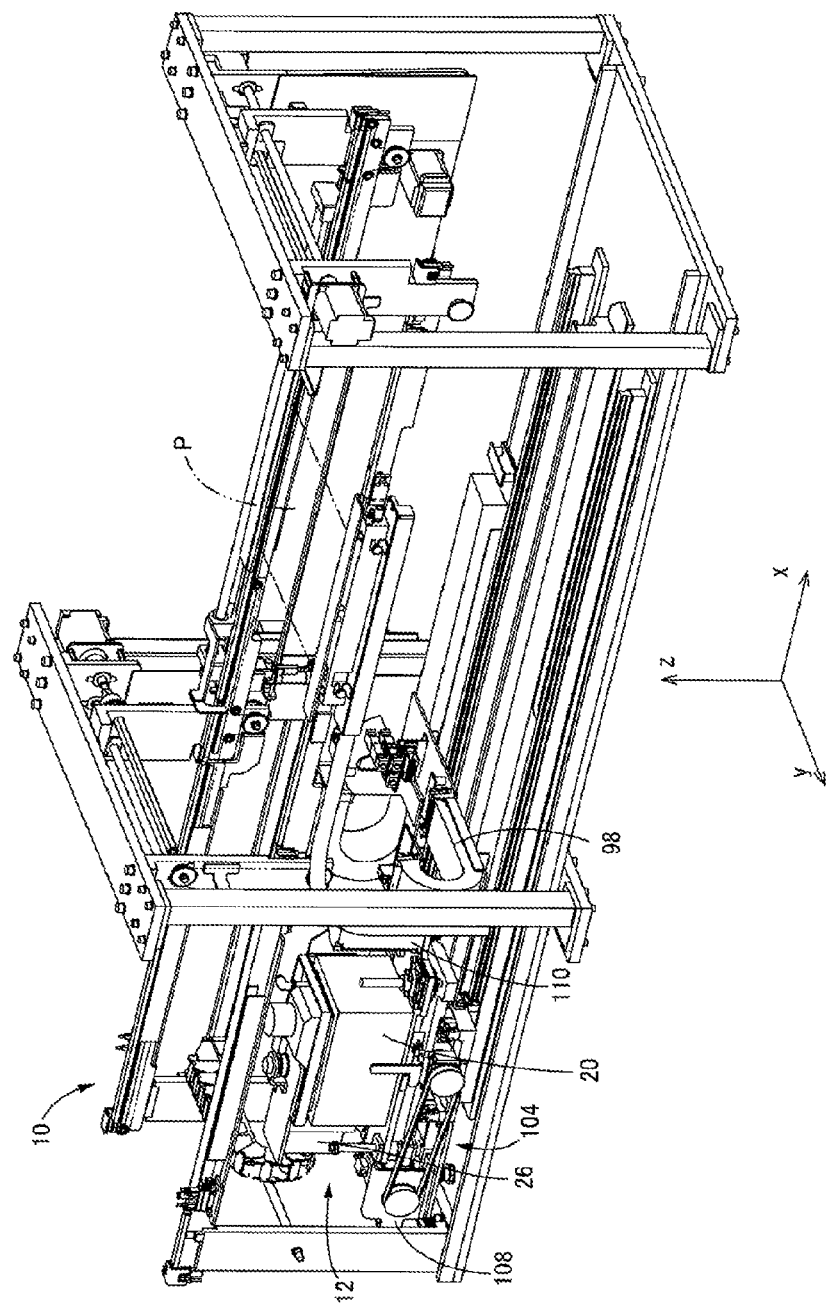
FIG. 1 is a perspective view of an electronic component mounter including a first embodiment of the viscous fluid coating device.

A first embodiment of the viscous fluid coating device is a so-called selective solderer which is provided in an electronic component mounter. With the electronic component mounter shown in FIG. 1, circuit board P is conveyed in the x direction by circuit board conveyance device 10, and is held at a predetermined component mounting position. Electronic components are placed onto circuit board P by the leads, connection terminals, or the like of the electronic component being inserted into through-holes formed in circuit board P by an electronic component insertion device, which is not shown. Also, solder paste (hereinafter referred to simply as solder) as a viscous fluid is applied in a point shape (spot shape) to a portion at which the leads, connections terminals, or the like have been inserted into the circuit board from below the circuit board by solder coating device 12 as a viscous fluid coating device, thus mounting the electronic component on circuit board P. In FIG. 1, the conveyance direction of circuit board P is referred to as x, the width direction of circuit board P is referred to as y, and the thickness direction (height direction of the component mounting device) of circuit board P is referred to as z. The x, y, and z directions are orthogonal to each other.

First Embodiment

—Configuration of Solder Coating Device—

Figure 2:
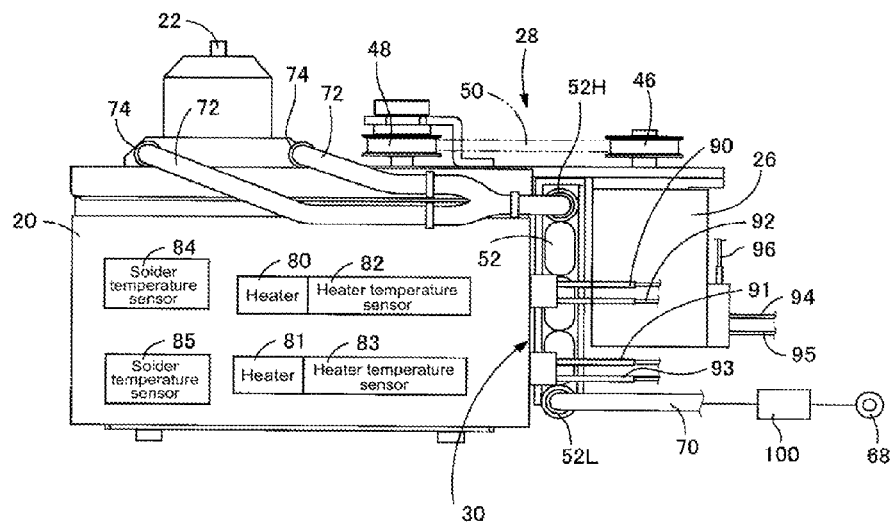
FIG. 2 is a front view of a solder coating device as the above viscous fluid coating device.
Figure 4A:
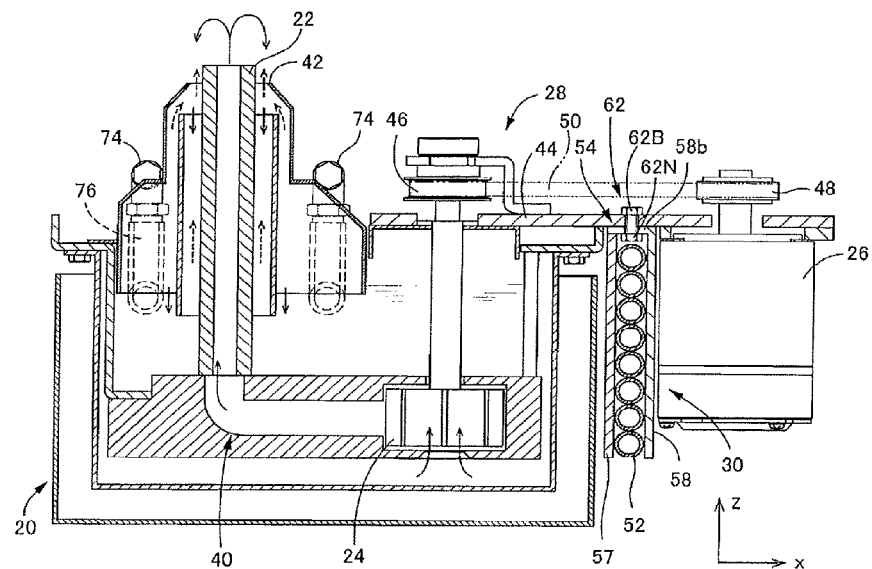
FIG. 4 is a cross section of the flow tank included in the above solder coating device.
Figure 4B:
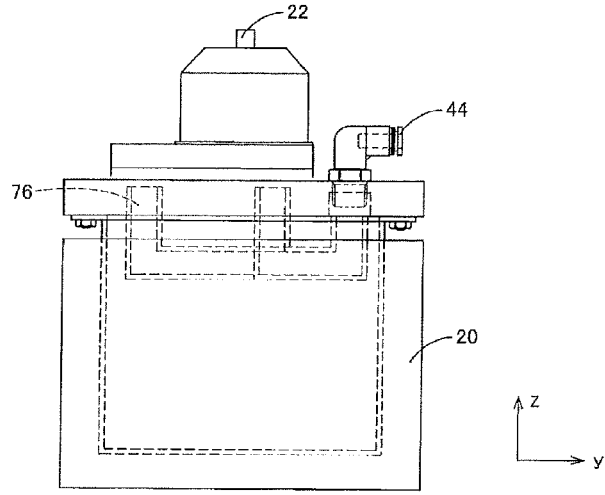

As shown in FIGS. 2 and 4, solder coating device 12 includes (a) flow tank 20 housing solder in a molten state, (b) impeller (hereinafter referred to as pump) 24, provided inside flow tank 20, that ejects solder from nozzle 22, (c) jet motor 26 that drives pump 24, (d) drive transmission section 28 that transmits movement of jet motor 26 to pump 24, (e) cooling device 30 that cools jet motor 26, and the like. As shown in FIG. 4, passage 40 is provided inside flow tank 20, with nozzle 22 provided at one end of passage 40 and pump 24 provided at the other end. Solder housed inside flow tank 20 is sucked inside the passage by pump 24 and ejected from nozzle 22. Solder that is ejected from nozzle 22 but does not coat circuit board P returns inside flow tank 20 via opening 42 provided around nozzle 22. Jet motor 26 is held on holding plate 44 that extends from the upper surface of flow tank 20, such that jet motor 26 is attached outside flow tank 20 at a position separated from flow tank 20. Drive transmission section 28 includes pulley 46 connected to the drive axis of pump 24 inside flow tank 20, pulley 48 connected to the output axis of jet motor 26, and belt 50 provided on this pair of pulleys 46 and 48.

Figure 3:
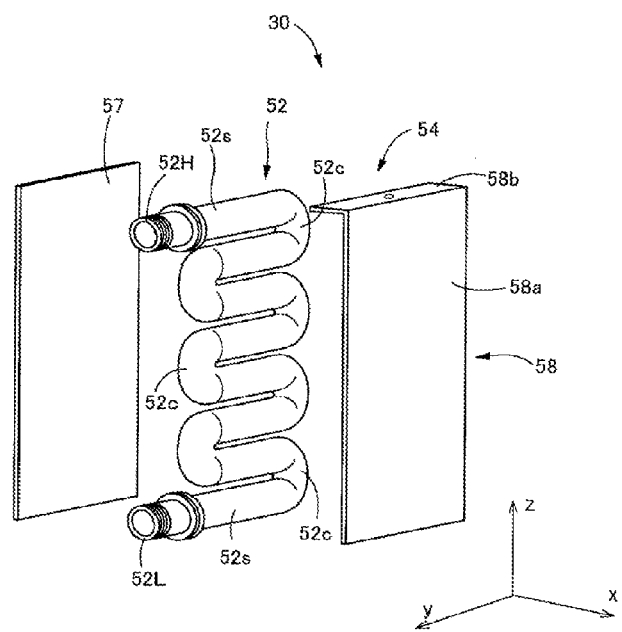
FIG. 3 is an exploded view of the cooling device provided in the above solder coating device.

As shown in FIG. 3, cooling device 30 includes (a) pipe 52 that is a passage for nitrogen gas, which is a liquid body, and (b) pipe holding section 54 that holds pipe 52; cooling device 30 is provided between jet motor 26 and flow tank 20. Pipe 52 includes multiple straight sections 52s that are parallel to each other, and multiple curved sections 52c that connect adjacent straight sections 52s to each other, such that pipe 52 has a form that folds back on itself; hereinafter pipe 52 is referred to as a cooling pipe. Cooling pipe 52 is attached such that straight sections 52s are substantially parallel to the y axis, with curved sections 52c substantially parallel to the yz plane and curved with respect to the z axis. Pipe holding section 54 includes pair of plates 57 and 58. Of the pair of plates 57 and 58, plate 57 is a flat plate, and a plate 58 is an L-shaped plate that includes first plate section 58a and second plate section 58b, which are perpendicular to each other. Cooling pipe 52 is held by this pair of plates 57 and 58.

Specifically, with pair of plates 57 and 58, cooling pipe 52 is sandwiched between first plate section 58a and flat plate 57, which are parallel to each other, with second plate section 58b provided above cooling pipe 52. Cooling pipe 52 is fixed to flat plate 57 by point attachment (spot welding) or the like, and first plate 58a is fixed to flat plate 57 by screws or the like. Second plate section 58b is fixed to holding plate 44 with fastening section 62. Fastening section 62 includes (a) nut 62N fixed to the lower surface of second plate section 58b, and (b) bolt 62B (refer to FIG. 4). Cooling device 30 is attached to holding plate 44 by bolt 62B passing through holding plate 44 and second plate section 58b in the thickness direction (z direction) and being engaged with nut 62N.

Cooling pipe 52 is connected to nitrogen gas supply source 68 (for example, a nitrogen gas cylinder) via pipe 70, and to flow tank 20 via pipe 72. In other words, pipe 70 is connected to connection section (joint) 52L provided at the upstream end of the lower section of cooling pipe 52, and pipe 72 is connected at one end to connection section (joint) 52H provided at the downstream end of the upper section of cooling pipe 52. The other end of pipe 72 is connected to a connection section (port 74) formed in flow tank 20. Cooling pipe 52 forms a portion of a passage that connects flow tank 20 and nitrogen gas supply source 68. As described above, cooling pipe 52 is formed such that flow from up to down does not occur. Accordingly, nitrogen gas supplied from connection section 52L of the lower section of cooling pipe 52 flows up cooling pipe following the curved path of the pipe, and flows out from connection section 52H of the upper section of cooling pipe 52 so as to be supplied into flow tank 20.

Nitrogen gas passage 76 is provided inside flow tank 20, and is connected to port 74. Nitrogen gas supplied from port 74 is supplied inside the flow tank via nitrogen gas passage 76. Nitrogen gas prevents oxidation of solder. Further, as shown in FIG. 2, provided inside flow tank 20 are heaters 80 and 81 that heat solder, heater temperature sensors (thermocouples) 82 and 83 that detect the temperature of heaters 80 and 81, and temperature sensors (thermocouples) 84 and 85 that detect the temperature of the solder, and the like. Heaters 80 and 81 are connected to a power source, not shown, via conducting wires 90 and 91. Further, heater temperature sensors 82 and 83, and temperature sensors 84 and 85, are connected to a power source via conducting wires 92 and 93, and conducting wires 94 and 95, respectively, Further, jet motor 26 is connected to a power source via conducting wire 96. Conducting wires 90 to 96 and pipe 70 and the like (98 in FIG. 1 indicates this bundle of conducting wires, pipes, and so on) are movable together with flow tank 20.

Figure 5:
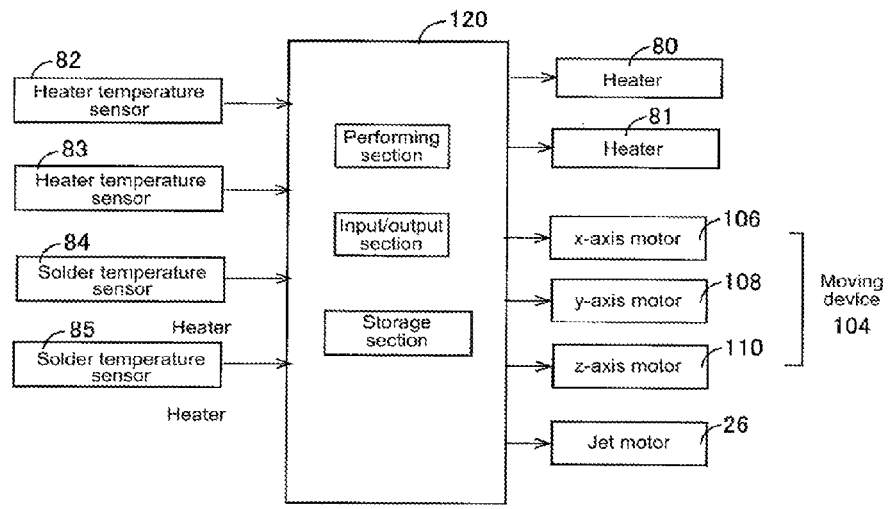
FIG. 5 shows control devices and peripheral items included in the solder coating device.

Nitrogen gas supply adjustment device 100 (refer to FIG. 2) is provided on the main body of nitrogen gas supply source 68, or somewhere along pipe 70. Nitrogen gas supply adjustment device 100, for example, includes at least one valve, and is switchable to and from an open state in which the supply of nitrogen gas from nitrogen gas supply source 68 to cooling device 30 is allowed, and a closed state in which supply is prevented, and is capable of adjusting the flow amount of nitrogen gas. Also, solder coating device 12 is moved in the x-axis, y-axis, and z-axis directions by moving device 104 (refer to FIG. 1). Moving device 104 includes x-axis motor 106 (refer to FIG. 5), y-axis motor 108, z-axis motor 110, or the like, and solder coating device 12 is moved in the x-axis, y-axis, and z-axis directions by the driving of x-axis motor 106, y-axis motor 108, z-axis motor 110, or the like.

The electronic component mounter is controlled by control device 120, configured mainly from a computer. Control device 120 is connected to heater temperature sensors 82 and 83, solder temperature sensors 84 and 85, and to jet motor 26, heaters 80 and 81, moving device 104, and the like, by switch circuits or the like, which are not shown. The heating state of heaters 80 and 81 is controlled such that the temperature of solder detected by solder temperature sensor 84 in flow tank 20 is maintained substantially at a set temperature. The heating state of heaters 80 and 81 is controlled based on the temperature of the heaters detected by heater temperature sensors 82 and 83. Also, solder temperature sensor 85 is provided to detect whether the temperature of the solder has reached the set temperature which is taken to be a heated state.

<Solder Coating Operation>

While solder coating operation is being performed, jet motor 26 operates continuously. Pump 24 is operated by the driving of jet motor 26, such that solder is sucked inside passage 40 and ejected from nozzle 22. Solder is continuously ejected from nozzle 22. Solder coating device 12 is moved in the x-axis and y-axis directions by moving device 104 to a predetermined position of circuit board P at which solder is to be coated (hereinafter referred to as solder coating target point), and at that position, is raised in the z direction to a height at which solder is to be coated. Then, after solder has been applied to the solder coating target point of board P, solder coating device 12 is lowered and moved to the next solder coating target point. Solder that is ejected from nozzle 22 but does not coat circuit board P returns inside flow tank 20 via opening 42.

<Cooling the Jet Motor>

In cooling device 30, a substantially uniform flow of nitrogen gas is supplied from nitrogen gas supply source 68. Nitrogen gas enters from connection section 52L on the lower section of cooling pipe 52, flows inside cooling pipe 52 and exits from connection section 52H on the upper section of cooling pipe 52. The temperature of the nitrogen gas increases due to heat dissipated from jet motor 26, thus lowering the temperature of jet motor 26. Heat is transferred from jet motor 26 to the nitrogen gas, and jet motor 26 is cooled satisfactorily. Because cooling pipe 52 folds back on itself, the nitrogen gas is inside the cooling pipe for a long time, thus the nitrogen gas can be effectively used to cool jet motor 26. Note that, the flow amount of nitrogen gas is set such that jet motor 26 is cooled satisfactorily. In this way, in the present embodiment, because cooling device 30 is provided, overheating of jet motor 26 is prevented satisfactorily. As a result, trouble caused by jet motor 26 overheating is less likely to occur, and solder is coated on circuit board P stably. Also, because cooling device 30 is provided between jet motor 26 and flow tank 20, heat is satisfactorily prevented from being transferred from flow tank 20 to jet motor 26, thus allowing jet motor 26 to be cooled satisfactorily. Further, the size of solder coating device 12 can be kept down.

<Preventing Oxidation of Solder>

Nitrogen gas flowing out from cooling device 30 is supplied into flow tank 20 via port 74 and nitrogen gas passage 76. Because nitrogen gas is supplied to a wide area inside flow tank 20, oxidation of solder is prevented satisfactorily. Also, nitrogen gas is ejected into the atmosphere from toric opening 42 around ejection nozzle 22, such that nitrogen gas contacts solder returned to flow tank 20 around opening 42. As a result, oxidation of solder is prevented.

<Others>

Conventionally, to prevent oxidation of solder, nitrogen gas is supplied inside flow tank 20. Due to this, port 74, nitrogen gas supply source 68, and the like for supplying nitrogen gas to flow tank 20 were provided on the electronic component mounter. In contrast, with the present embodiment, nitrogen gas is supplied to cooling device 30 before being supplied to flow tank 20, such that nitrogen gas is used for both preventing oxidation of solder and for cooling jet motor 26. Thus, with the present embodiment, it is sufficient to newly provide cooling device 30, and it is not necessary to provide port 74, nitrogen gas supply source 68, and the like dedicated for cooling jet motor 26. As a result, jet motor 26 can be cooled while curtailing cost rises. Also, with cooling device 30, the temperature of the nitrogen gas increases due to heat dissipated by jet motor 26. Due to this, the temperature of nitrogen gas supplied to flow tank 20 is higher compared to a case in which nitrogen gas is supplied directly from nitrogen gas supply source 68, thus a decrease in the temperature of the solder caused by supply of nitrogen gas to the flow tank is satisfactorily prevented.

Second Embodiment

Figure 6:
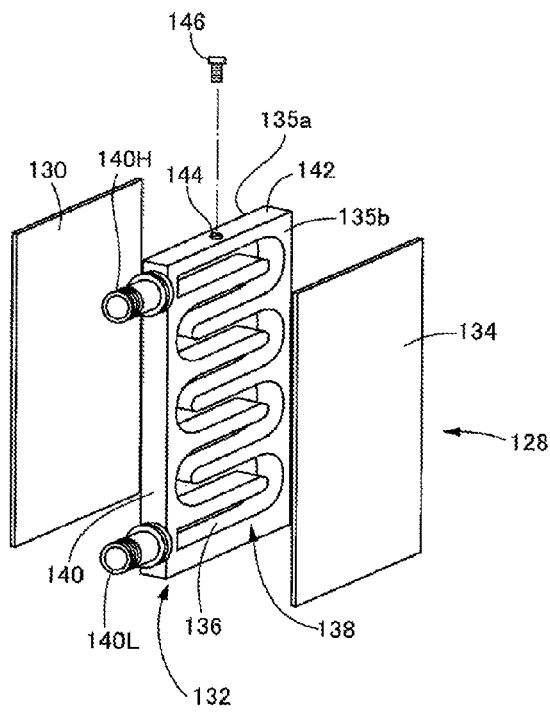
FIG. 6 is an exploded view of the cooling device of a second embodiment of the viscous fluid coating device.

As shown in FIG. 6, cooling device 128 includes three passage configuration members 130, 132, and 134, which are substantially flat plates joined to each other so as to be airtight. Passage configuration member 132, which is positioned in the middle, is open at both surfaces 135a and 135b, and has passage hole 136 formed through it in the thickness direction. Passage configuration members 130 and 134 are joined by welding so as to be airtight to end surfaces 135a and 135b of passage configuration member 132 such that the openings are covered, thereby forming nitrogen gas passage 138. Hereinafter, passage configuration member 132 is referred to as a passage-hole-forming member, and passage configuration members 130 and 134, which act as blocking members, are referred to as blocking plates. Note that, passage hole 136 is shaped so as to form nitrogen gas passage 138 that folds back on itself. Also, a side cross section of nitrogen gas passage 138 is square. Connection sections 140L and 140H are formed piercing through passage hole 136 at the lower section and upper section of end surface 140 of passage-hole-forming member 132. Similar to the first embodiment, pipe 70 is connect to connection section 140L, and pipe 72 is connected to connection section 140H. Also, screw hole 144 is formed in upper surface 142 of passage-hole-forming member 132. Cooling device 128 is attached to holding plate 44 by screw member 146, acting as a fastening member, being engaged with screw hole 144 of passage-hole-forming member 132 via holding plate 44. In this way, with the present embodiment, passage-hole-forming member 132 also functions as a holding section. In a similar way to the first embodiment, with the present embodiment also, overheating of jet motor 26 is curtailed, such that oxidation of solder is satisfactorily prevented. Note that, each of passage-hole-forming member 132 and blocking plates 130 and 134 may be joined using a fastening device such as a screw via a sealing member.

Note that, it is not essential that cooling devices 30 and 128 are provided between flow tank 20 and jet motor 26; cooling devices 30 and 128 may be provided at a position 180 degrees relative to flow tank 20 (on the opposite side to flow tank 20), or at a position 90 degrees from flow tank 20. Alternatively, the cooling device may be provided between jet motor 26 and holding plate 44, or below jet motor 26. Alternatively, the cooling pipe may be a spiral shape that winds around the outside of jet motor 26. Further, cooling devices 30 and 128 may be attached contacting jet motor 26 (contacting the housing of the jet motor). Also, it is not essential that nitrogen gas flowing from cooling devices 30 and 128 is supplied inside flow tank 20. For example, nitrogen gas used for cooling may be used for an operation related to solder coating operation to the circuit board such as heating of circuit board P. On the other hand, nitrogen gas may be released to the atmosphere after being used for cooling. Further, the liquid body used in cooling devices 30 and 128 is not limited to nitrogen gas, another inert gas or the like that prevents oxidation may be used. In other ways too, the present disclosure is not limited to the above embodiments and may be realized with various modifications and improvements based on knowledge of someone skilled in the art.

REFERENCE SIGNS LIST

12: solder coating device; 20: flow tank; 22: nozzle; 24: pump; 26: jet motor; 30: cooling device; 42: opening; 52: cooling pipe; 57, 58: plate; 62: fastening section; 70, 72: pipe; 74: connection port; 128: cooling device; 130, 134: blocking plate; 132: passage-hole-forming member; 136: passage hole; 138: nitrogen gas passage

The invention claimed is:

1. A viscous fluid coating device comprising:
a flow tank that houses a viscous fluid in a molten state;
a pump, operation of which ejects viscous fluid from the flow tank such that viscous fluid is coated on a circuit board;
a jet motor, provided outside the flow tank, that drives the pump; and
a cooling device provided outside the flow tank and including a passage through which cooling fluid is to flow, the cooling device located adjacent the jet motor to cool the jet motor using the cooling fluid,
wherein a downstream end of the passage is connected to the flow tank such that the cooling fluid is provided to the flow tank after cooling the jet motor.

2. The viscous fluid coating device according to claim 1, wherein at least a portion of the passage is provided between the flow tank and the jet motor.

3. The viscous fluid coating device according to claim 1, wherein
the passage includes multiple curved sections, and
the cooling device includes a heat exchange section provided with the passage formed from the multiple curved sections.

4. The viscous fluid coating device according to claim 1, wherein the viscous fluid is solder, and the cooling fluid is an antioxidation gas to prevent oxidation of the solder.

5. A viscous fluid coating device comprising:
a flow tank that houses a viscous fluid in a molten state;
a pump, operation of which ejects viscous fluid from the flow tank such that viscous fluid is coated on a circuit board;
a jet motor, provided outside the flow tank, that drives the pump; and
a cooling device, provided outside the flow tank and including a passage through which cooling fluid is to flow, the cooling device located adjacent the jet motor to cool the jet motor using the cooling fluid,
wherein an upstream end of the passage is connected to a cooling fluid tank, and
wherein the cooling fluid is provided to the flow tank after cooling the jet motor.

6. The viscous fluid coating device according to claim 5, wherein at least a portion of the passage is provided between the flow tank and the jet motor.

7. The viscous fluid coating device according to claim 5, wherein
the passage includes multiple curved sections, and
the cooling device includes a heat exchange section provided with the passage formed from the multiple curved sections.

8. The viscous fluid coating device according to claim 5, wherein the viscous fluid is solder, and the cooling fluid is an antioxidation gas to prevent oxidation of the solder.

9. The viscous fluid coating device according to claim 1, wherein the flow tank includes an ejection nozzle to eject the viscous fluid, and the cooling fluid is ejected to contact the viscous fluid returning to the flow tank.

10. The viscous fluid coating device according to claim 5, wherein the flow tank includes an ejection nozzle to eject the viscous fluid, and the cooling fluid is ejected to contact the viscous fluid returning to the flow tank.

* * * * *